United States Patent
Toyama et al.

(10) Patent No.: US 11,876,519 B2
(45) Date of Patent: Jan. 16, 2024

(54) OSCILLATION CIRCUIT, TIME-TO-DIGITAL CONVERTER, AND ELECTRONIC DEVICE

(71) Applicant: KABUSHIKI KAISHA TOSHIBA, Tokyo (JP)

(72) Inventors: Yosuke Toyama, Kanagawa (JP); Tuan Thanh Ta, Kanagawa (JP); Satoshi Kondo, Kanagawa (JP); Akihide Sai, Kanagawa (JP); Toshiki Sugimoto, Kanagawa (JP); Kentaro Yoshioka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 17/468,431

(22) Filed: Sep. 7, 2021

(65) Prior Publication Data
US 2022/0190812 A1 Jun. 16, 2022

(30) Foreign Application Priority Data
Dec. 11, 2020 (JP) ................... 2020-206052

(51) Int. Cl.
*H03K 3/03* (2006.01)
*G04F 10/00* (2006.01)

(52) U.S. Cl.
CPC ......... *H03K 3/0315* (2013.01); *G04F 10/005* (2013.01)

(58) Field of Classification Search
CPC ................... H03K 3/0315; G04F 10/005
See application file for complete search history.

(56) References Cited

U.S. PATENT DOCUMENTS

| | | | |
|---|---|---|---|
| 6,683,503 B2 | 1/2004 | Mizuno et al. | |
| 7,183,864 B1 * | 2/2007 | Gutnik | H03K 3/0322 331/34 |
| 11,545,963 B1 * | 1/2023 | Zick | G06N 5/01 |
| 11,573,321 B2 | 2/2023 | Kondo et al. | |
| 2003/0137358 A1 * | 7/2003 | Lee | H03B 27/00 331/57 |
| 2004/0041641 A1 * | 3/2004 | Nakajima | G01R 31/275 331/57 |
| 2019/0097577 A1 * | 3/2019 | Soares | H03K 3/354 |
| 2019/0268010 A1 * | 8/2019 | Wu | G04F 10/04 |
| 2020/0158872 A1 | 5/2020 | Kondo et al. | |
| 2020/0192301 A1 * | 6/2020 | Khoury | H03L 7/085 |

FOREIGN PATENT DOCUMENTS

JP 3619352 B2 2/2005
JP 2020-85537 A 6/2020

* cited by examiner

*Primary Examiner* — Jean B Jeanglaude
(74) *Attorney, Agent, or Firm* — Finnegan, Henderson, Farabow, Garrett & Dunner, LLP

(57) ABSTRACT

An oscillation circuit has a first oscillator having output nodes of n stages, where n is an integer of 3 or more, a second oscillator having output nodes of n stages, and a third oscillator having output nodes of n stages. An output node at an a-th stage of the first oscillator and an output node at an a-th stage of the second oscillator are connected with each other, where a is an integer of 1 or more and n or less and an output node at a b-th stage of the second oscillator and an output node at a b-th stage of the third oscillator are connected with each other, where b is an integer of 1 or more and n or less different from a.

18 Claims, 8 Drawing Sheets

| N1 | N2 | N3 | FIRST PHASE INFORMATION |
|---|---|---|---|
| 0 | 1 | 0 | 0 |
| 1 | 1 | 0 | 1 |
| 1 | 0 | 0 | 2 |
| 1 | 0 | 1 | 3 |
| 0 | 0 | 1 | 4 |
| 0 | 1 | 1 | 5 |

FIG. 2

OSCILLATION CIRCUIT, TIME-TO-DIGITAL CONVERTER, AND ELECTRONIC DEVICE

CROSS REFERENCE TO RELATED APPLICATIONS

This application is based upon and claims the benefit of priority from the prior Japanese Patent Application No. 2020-206052, filed on Dec. 11, 2020, the entire contents of which are incorporated herein by reference.

FIELD

The present disclosure relates to an oscillation circuit, a time-to-digital converter, and an electronic device.

BACKGROUND

When specific outputs of a plurality of oscillators are connected with each other, phases are injected into each other, so that phase noise can be reduced, and a highly accurate time signal can be generated.

However, when each output of the plurality of oscillators is connected with one node, the parasitic capacitance of this node increases, the symmetry with another output of each oscillator deteriorates, and the linearity of the oscillation signal deteriorates.

BRIEF DESCRIPTION OF THE DRAWINGS

FIG. 2 is a diagram illustrating phase states of three output nodes of an oscillator, and first phase information;

DETAILED DESCRIPTION

Figure 1:
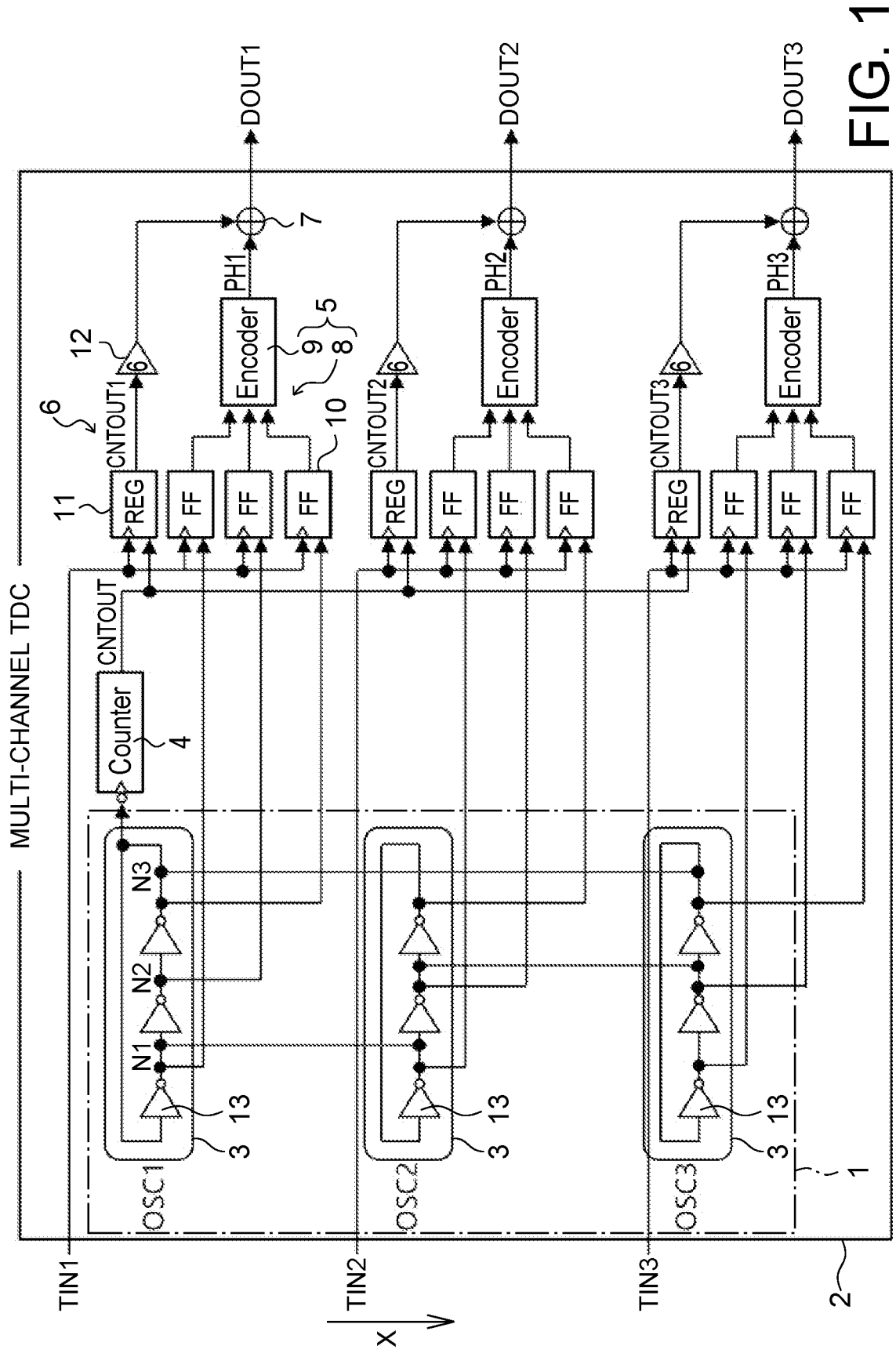
FIG. 1 is a block diagram illustrating a schematic configuration of a time-to-digital converter having an oscillation circuit according to a first embodiment incorporated therein.

According to one embodiment an oscillation circuit comprising:
 a first oscillator having output nodes of n stages, where n is an integer of 3 or more;
 a second oscillator having output nodes of n stages; and
 a third oscillator having output nodes of n stages,
 wherein an output node at an a-th stage of the first oscillator and an output node at an a-th stage of the second oscillator are connected with each other, where a is an integer of 1 or more and n or less and
 an output node at a b-th stage of the second oscillator and an output node at a b-th stage of the third oscillator are connected with each other, where b is an integer of 1 or more and n or less different from a.

The following description will explain embodiments of an oscillation circuit, a time-to-digital converter, and an electronic device with reference to the drawings. Although main components of an oscillation circuit, a time-to-digital converter, and an electronic device will be mainly described hereinafter, the oscillation circuit, the time-to-digital converter, and the electronic device may have components and functions that are not shown in the drawings or described herein. The following description does not exclude components or functions that are not shown in the drawings or described herein.

First Embodiment

FIG. 1 is a block diagram illustrating a schematic configuration of a time-to-digital converter 2 having an oscillation circuit 1 according to the first embodiment incorporated therein. The time-to-digital converter 2 according to the present embodiment has a multi-channel configuration, and converts multi-channel time signals into digital signals in parallel. Although the time-to-digital converter 2 illustrated in FIG. 1 has a three-channel configuration, the time-to-digital converter can be applied to any number of channels equal to or more than two channels. The time-to-digital converter 2 in FIG. 1 converts the timings of the rising edges of three time signals TIN1, TIN2, and TIN3 into digital signals DOUT1, DOUT2, and DOUT3.

The time-to-digital converter 2 in FIG. 1 includes the oscillation circuit 1 having a plurality of oscillators 3, a counter 4, a plurality of phase detectors 5, a plurality of count holding units (count holders) 6, and a plurality of digital signal generation units (digital signal generators) 7.

The plurality of oscillators 3 in the oscillation circuit 1 output oscillation signals having no phase shift. The plurality of oscillators 3 are aligned in a predetermined direction X, and each oscillator 3 has a plurality of output nodes capable of outputting oscillation signals having different phases. The oscillation signals outputted from corresponding output nodes in the plurality of oscillators 3 have the same phase and frequency. As a specific configuration of an oscillator 3 will be described later, each oscillator 3 in FIG. 1 has three output nodes N1, N2, and N3 that output three oscillation signals having different phases.

The counter 4 measures the periodicity of an oscillation signal outputted from any one of the plurality of oscillators 3. Since the plurality of oscillators 3 output oscillation signals having the same phase and frequency from corresponding output nodes, an oscillation signal outputted from any one oscillator 3 may be inputted to the counter 4.

When the logic of a corresponding time signal transitions, the plurality of phase detectors 5 detect phases of a plurality of oscillation signals having different phases outputted from corresponding oscillators 3. Each phase detector 5 has a phase holding unit (phase holder) 8 and an encoder 9.

Each phase holding unit 8 holds the phase of an oscillation signal outputted from a corresponding oscillator 3 in synchronization with the timing (e.g., timing of transition from low to high) at which the logic of the corresponding time signal transitions. The phase holding unit 8 has, for example, a plurality of flip flops (which will be hereinafter referred to as F/Fs) 10. Each F/F 10 holds the phase of a corresponding oscillator 3 in synchronization with the timing (e.g., timing of transition from low to high) at which the logic of the corresponding time signal transitions. Each encoder 9 encodes the phases of the plurality of oscillation signals held by the phase holding unit 8 to generate first phase information.

The plurality of count holding units 6 hold count values of the counter 4 when the logic of a corresponding time signal transitions. Each count holding unit 6 has, for example, a register 11 and a multiplier 12. Each register 11 holds the count value of the counter 4 in synchronization with the timing (e.g., timing of transition from low to high) at which the logic of the time signal transitions. Since the counter 4 counts up every 6 times, for example, of the minimum unit of the phase detected by the phase detector 5, the multiplier 12 generates second phase information by multiplying the count value held by the register 11 by 6.

The plurality of digital signal generation units 7 generate a plurality of digital signals DOUT1 to DOUT3 according to the plurality of time signals based on the count values held by the plurality of count holding units 6 and the phases detected by the plurality of phase detectors 5. More specifically, each digital signal generation unit 7 synthesizes the second phase information outputted from the corresponding count holding unit and the first phase information outputted from the corresponding phase detector 5 to generate a digital signal corresponding to the corresponding time signal.

The time-to-digital converter 2 in FIG. 1 converts a time signal into a digital signal based on the phase of the oscillator 3 and the count value of the counter 4 at the timing at which the time signals TIN1 to TIN3 transition from low to high. In a case where the number of stages of an oscillator 3 is three, the phase state of the oscillator 3 can take six types from 0 to 5.

FIG. 2 is a diagram illustrating phase states of three output nodes N1, N2, and N3 of an oscillator 3, and first phase information. The first phase information is a value obtained by coding the phase states of the three output nodes. Each encoder 9 outputs the first phase information corresponding to the phase states of the three output nodes of the oscillator 3.

Figure 3:
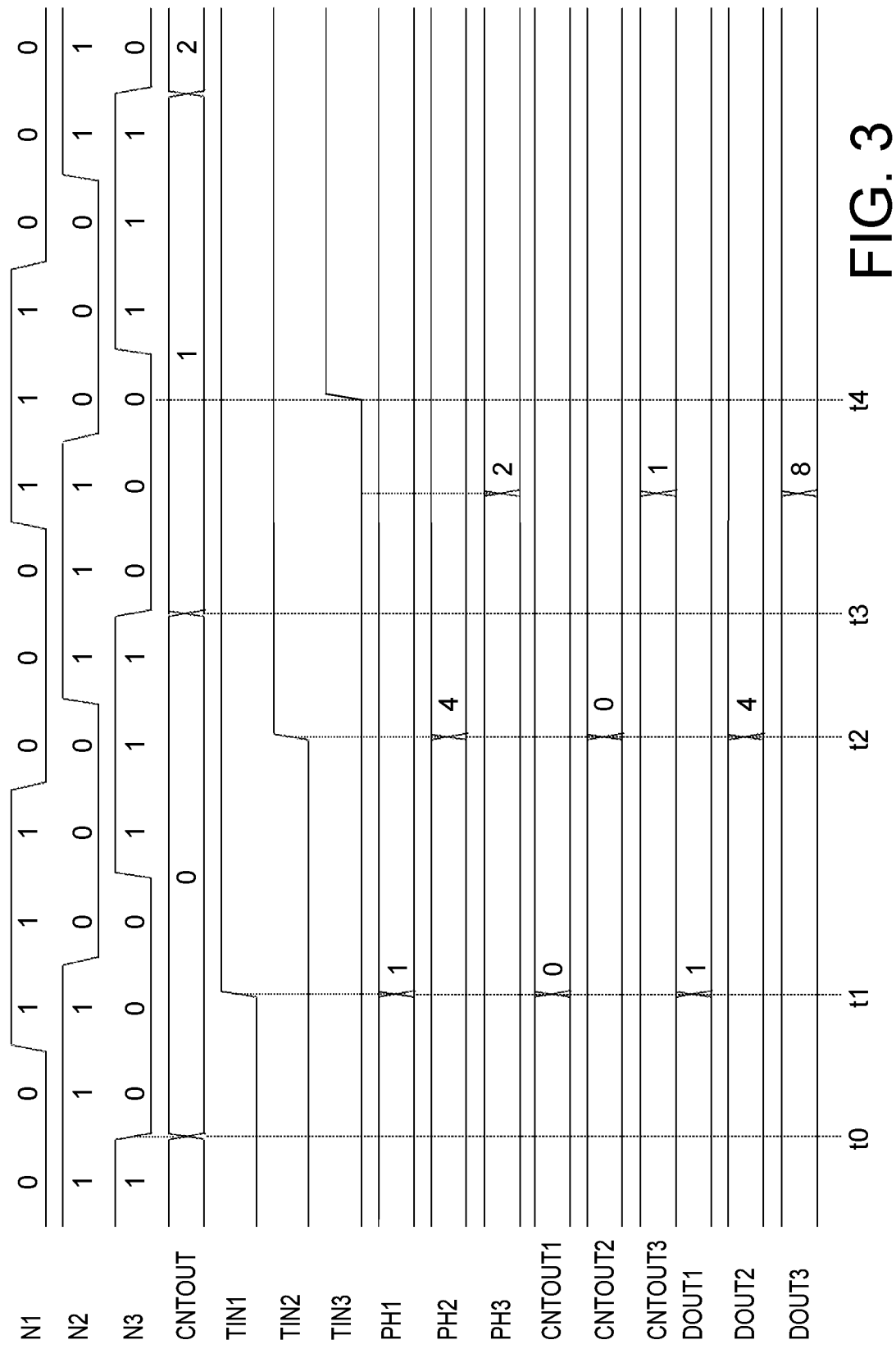
FIG. 3 is a timing waveform diagram of an oscillator in FIG. 1.

FIG. 3 is a timing waveform diagram of phase states of three output nodes N1, N2, and N3 of each oscillator 3, a count value CNTOUT of the counter 4, time signals TIN1, TIN2, and TIN3, first phase information PH1, PH2, and PH3 encoded by each encoder 9, count values CNTOUT1, CNTOUT2, and CNTOUT3 held in each register 11, and respective digital signals DOUT1, DOUT2, and DOUT3.

The example of FIG. 3 illustrates an example in which the count value CNTOUT of the counter 4 becomes 0 at a timing at which the output node N3 of the oscillator 3 transitions from high to low at time t0. Thereafter, the time signal TIN1 transitions from low to high at time t1. At this time, the phase states of the three output nodes N1, N2, and N3 of the corresponding oscillator 3 are (110). Therefore, first phase information encoded by the corresponding encoder 9 satisfies PH1=1. Moreover, at time t1, since the count value of the counter 4 satisfies CNTOUT=0, the register 11 holds 0, and the second phase information outputted from the multiplier 12 becomes 0. Therefore, the digital signal generation unit 7 at the uppermost stage in FIG. 1 outputs DOUT1=1.

Thereafter, the time signal TIN2 transitions from low to high at time t2. At this time, the phase states of the three output nodes N1, N2, and N3 of the corresponding oscillator 3 are (001). Therefore, first phase information encoded by the corresponding encoder 9 satisfies PH2=4. At this time, the second phase information outputted from the multiplier 12 remains 0. Therefore, the digital signal generation unit 7 at the middle stage in FIG. 1 outputs DOUT2=4.

Thereafter, at time t3, the output node N3 of the oscillator 3 transitions from high to low, and the count value of the counter 4 becomes 1. Thereafter, the time signal TIN3 transitions from low to high at time t4. At this time, the phase states of the three output nodes N1, N2, and N3 of the corresponding oscillator 3 are (100). Therefore, first phase information encoded by the corresponding encoder 9 satis-fies PH2=2. Moreover, at time t4, since the count value of the counter 4 satisfies CNTOUT=1, the register 11 holds 1, and the second phase information outputted from the multiplier 12 becomes 6. Therefore, the digital signal generator at the lowest stage in FIG. 1 outputs DOUT3=6+2=8.

The registers 11 in the count holding units 6 in FIG. 1 may be arranged apart between channels. In a case where a time signal is used in a spatially separated place, although it is conceivable to use a repeater to compensate for attenuation of the signal, an error is superimposed on the time signal due to manufacturing variation of the repeater or noise. Therefore, in FIG. 1, a plurality of oscillators 3 are provided in the oscillation circuit 1, and the output nodes of adjacent oscillators 3 are connected with each other to perform phase injection. Moreover, the output nodes of three or more oscillators 3 are prevented from being connected with each other at one place, thereby preventing an increase in parasitic capacitance. As described above, regarding the oscillation circuit 1 according to the present embodiment, different output nodes are connected with each other for each combination of two oscillators 3 among the plurality of oscillators 3 aligned in the predetermined direction X.

Each oscillator 3 in the oscillation circuit 1 in FIG. 1 has a plurality of delay elements 13 connected in cascade. Each delay element 13 can include, for example, a logic inversion element (inverter). The phase injection can be performed by connecting output nodes of delay elements 13 at a predetermined stage in two adjacent oscillators 3 with each other. As a result, the phase is shared by the oscillators 3, and the phase noise can be reduced at the same time. It is possible with the oscillation circuit 1 in FIG. 1 to suppress the area per one oscillator 3 and the power consumption as compared with a case where constant phase noise performance is realized by a single oscillator 3. The oscillation circuit 1 in FIG. 1 has the delay elements 13 having the number of stages corresponding to the number of bits of the digital signal to be generated, and the output nodes of the corresponding delay elements 13 of the oscillators 3 adjacent in the predetermined direction X are connected with each other, so that the phase noise performance of the oscillation circuit 1 can be maintained constant.

In the present embodiment, the delay element 13 itself of each oscillator 3 plays a role instead of a repeater that sends a signal. That is, by using a plurality of oscillators 3, it is possible not only to digitize the time signal but also to transmit the time signal to a separated place.

Although phase injection can be performed by connecting specific output nodes of all oscillators 3 with each other at one place, the parasitic capacitance increases, and the symmetry deteriorates. Therefore, in the present embodiment, any output nodes are connected with each other for each combination of two oscillators 3 among the plurality of oscillators 3, and different output nodes are connected with each other between one combination of two oscillators 3 and another combination of two oscillators 3. As a result, output nodes of a large number of oscillators 3 are prevented from being concentratedly connected at one place, so that the parasitic capacitance of each output node of the oscillator 3 can be reduced.

Different output nodes may be connected with each other for all combinations of two oscillators 3 among the plurality of oscillators 3. Moreover, since the parasitic capacitance can be reduced as the wiring connecting output nodes of the two oscillators 3 is shorter, it is desirable to connect output nodes of two oscillators 3 adjacent in the predetermined direction X with each other. Here, different output nodes are connected with each other between two oscillators 3 adjacent in the predetermined direction X and other two oscillators 3 adjacent in the predetermined direction X. As a result, the parasitic capacitance at the output nodes of the oscillators 3 can be reduced. Moreover, different output nodes may be connected with each other for all combinations of two adjacent oscillators 3 among the plurality of oscillators 3. The symmetry and the linearity can be improved by connecting output nodes with each other for all combinations.

The oscillator 3 may be a ring oscillator in which a plurality of delay elements 13 are annularly connected. In this case, the output signal from a delay element 13 at the last stage among the plurality of delay elements 13 connected in cascade is fed back to the input side of a delay element 13 at the first stage.

The delay elements 13 having connected output nodes of two oscillators 3 adjacent in the alignment order in the predetermined direction X may be arranged to be shifted by a predetermined number of stages according to the arrangement order in the predetermined direction X. The predetermined number of stages is determined according to the number of the plurality of delay elements 13 in each oscillator 3 and the number of the plurality of oscillators 3. The symmetry and the linearity are improved by connecting the output nodes of the delay elements 13 to be shifted by a predetermined number of stages.

The plurality of oscillators 3 in the oscillation circuit 1 can be connected in a loop shape by connecting the output nodes of the delay elements 13 at different stages in any two oscillators 3 with each other. This can improve the linearity. How to connect the plurality of oscillators 3 with each other to improve the linearity is determined based on the relationship between the number of stages of the delay elements 13 in each oscillator 3 and the number of oscillators 3.

The oscillation circuit 1 according to the first embodiment has three oscillators 3 as a minimum configuration. When these oscillators 3 are referred to as a first oscillator, a second oscillator, and a third oscillator, each of the first to third oscillators has output nodes of n (n is an integer of 3 or more) stages. One output node outputs an oscillation signal having a phase different from that of another output node. An output node at the a-th (a is an integer of 1 or more and n or less) stage of the first oscillator and an output node at the a-th stage of the second oscillator are connected with each other. Moreover, an output node at the b-th (b is an integer of 1 or more and n or less, different from a) stage of the second oscillator and an output node at the b-th stage of the third oscillator are connected with each other.

Note that the number of stages of the output nodes in the first to third resonators may be different. In this case, a node at the a-th stage of the first oscillator and a node at the b-th stage of the second oscillator are connected with each other. Moreover, a node at the c-th stage of the second oscillator and a node at the d-th stage of the third oscillator are connected with each other. In this case, the values of b and c are different, and the values of a and b may be the same or different. The values of a and d may be the same or different. The values of c and d may be the same or different.

As described above, in the first embodiment, output nodes of delay elements 13 at different stages are connected with each other for each combination of two oscillators 3 among the plurality of oscillators 3 in the oscillation circuit 1, so that the parasitic capacitance is not concentrated at one place, and the parasitic capacitance can be dispersed to a plurality of places. This improves the linearity when digitizing the time signal. Moreover, since output nodes of delay elements 13 at different stages are connected with each other for each combination of two oscillators 3 among the plurality of oscillators 3, the plurality of oscillators 3 can be connected in a loop shape, and the symmetry and the linearity can be improved. Furthermore, the delay elements 13 having connected output nodes are shifted by a predetermined stage in the alignment order of the plurality of oscillators 3, so that the symmetry and the linearity can be improved.

Second Embodiment

In a case where the number of oscillators 3 in the oscillation circuit 1 is larger than the number of connection stages of the delay elements 13 in one oscillator 3, the number of stages of the delay elements 13 to be connected becomes insufficient even if it is attempted to connect the output nodes of the delay elements 13 at different stages with each other for each combination of two oscillators 3 among the plurality of oscillators 3 in the oscillation circuit 1. Therefore, in the oscillation circuit 1 according to the second embodiment, the plurality of oscillators 3 may be classified into a plurality of oscillator groups 14 each having two or more oscillators 3, and the output nodes of two oscillators 3 may be connected with each other to be shifted for each oscillator group 14 in a case where the number of oscillators 3 in the oscillation circuit 1 is larger than the number of connection stages of the delay elements 13 in one oscillator 3.

Figure 4:
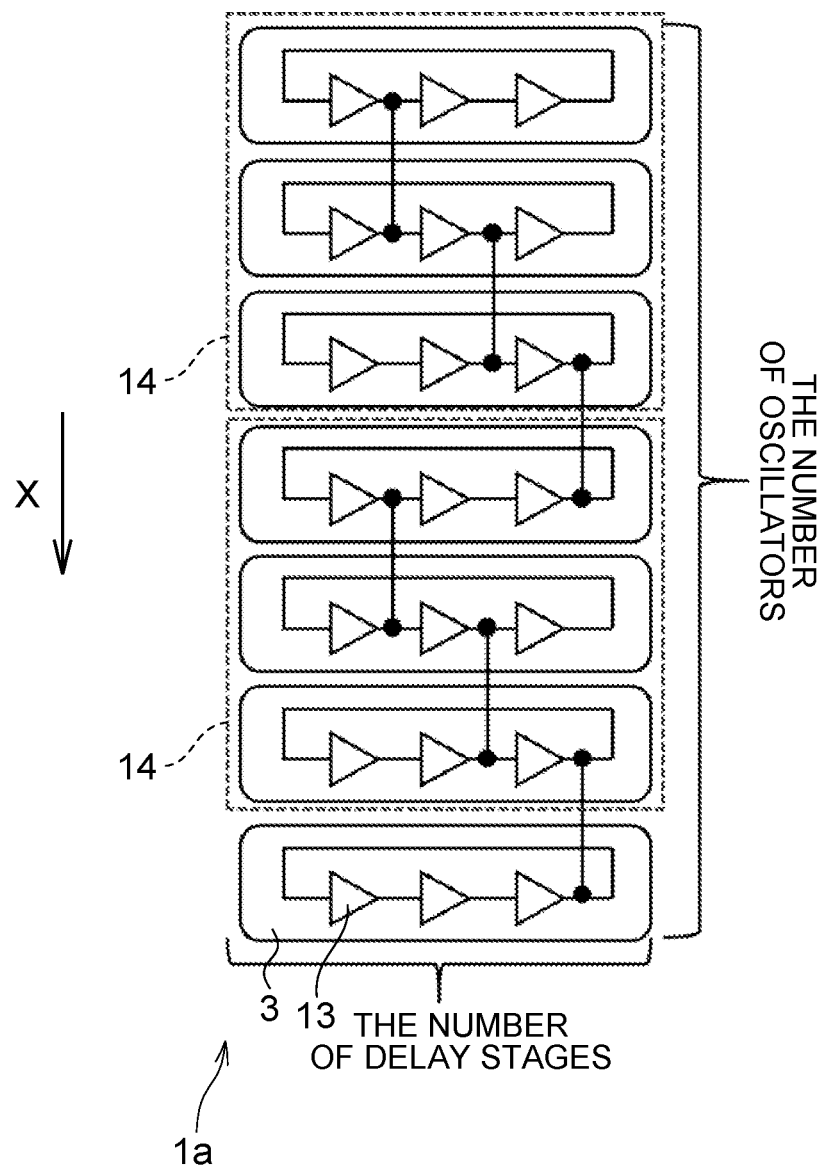
FIG. 4 is a circuit diagram of an oscillation circuit having a plurality of oscillators according to a second embodiment.

FIG. 4 is a circuit diagram of an oscillation circuit 1a having a plurality of oscillators 3 according to the second embodiment. The oscillation circuit 1a in FIG. 4 can be used instead of the oscillation circuit 1 in the time-to-digital converter 2 in FIG. 1. The oscillation circuit 1a in FIG. 4 includes a plurality of oscillator groups 14 aligned in a predetermined direction X. Although two oscillator groups 14 are illustrated in FIG. 4, the number of oscillator groups 14 is not particularly limited. Moreover, an oscillator 3 that does not belong to any oscillator group 14 may be present as illustrated in FIG. 4, or may not be present. Each oscillator group 14 includes a plurality of oscillators 3 aligned in the predetermined direction X. Each oscillator 3 has a plurality of delay elements 13 annularly connected. The delay element 13 is, for example, an inverter that inverts the logic. Although the oscillator 3 in FIG. 4 has delay elements 13 of three stages annularly connected, the number of connection stages of the delay elements 13 is arbitrary.

The oscillation circuit 1a illustrated in FIG. 4 is an example in which the number of oscillators 3 is larger than the number of connection stages of the delay elements 13 in each oscillator 3. In the case of FIG. 4, there are only three output nodes in each oscillator 3, while there are four or more combinations of two oscillators 3 adjacent in the predetermined direction X. Therefore, a plurality of combinations of two oscillators 3 are provided for each oscillator group 14 having three or less oscillators 3, and delay elements 13 of different stages are connected for each combination.

As a result, in the oscillation circuit 1a according to the second embodiment, output nodes of a plurality of oscillators 3 are also prevented from being concentratedly connected at one place, so that the parasitic capacitance can be evenly dispersed, and the linearity when digitizing the time signal is improved. Moreover, the output nodes of the delay elements 13 can be connected with each other to be shifted by one stage, for example, for each combination of two oscillators 3 in each of the plurality of oscillator groups 14, and the symmetry and the linearity can be improved.

In the oscillation circuit 1a in FIG. 4, the delay elements 13 having connected output nodes in two oscillators 3 adjacent in the alignment order in the predetermined direction X are arranged to be shifted by a predetermined number of stages according to the arrangement order in the predetermined direction X for each oscillator group 14. Moreover, output nodes of two oscillator groups 14 may be connected for every two oscillator groups 14. Regarding the plurality of oscillator groups 14, all oscillators 3 in the plurality of oscillator groups 14 can be connected in a loop shape by connecting output nodes for every two oscillator groups 14. By connection in a loop shape, the parasitic capacitance can be evenly dispersed, the symmetry is improved, and the linearity is also improved.

As described above, in the second embodiment, in a case where the number of oscillators 3 in the oscillation circuit 1a is larger than the number of delay elements 13 in one oscillator 3, the plurality of oscillators 3 in the oscillation circuit 1a are classified into the plurality of oscillator groups 14 each including two or more oscillators 3, and different output nodes are connected with each other for each combination of two oscillators 3 among the plurality of oscillators 3 aligned in the predetermined direction X for each oscillator group 14. Thus, the symmetry and the linearity can be improved for each oscillator group 14. Moreover, the parasitic capacitance can be evenly dispersed by connecting output nodes of two oscillator groups 14 with each other.

Third Embodiment

In a case where the number of oscillators 3 is smaller than the number of connection stages of the delay elements 13 in each oscillator 3 contrary to the second embodiment, the delay elements 13 having connected output nodes may be shifted by a plurality of stages.

Figure 5:
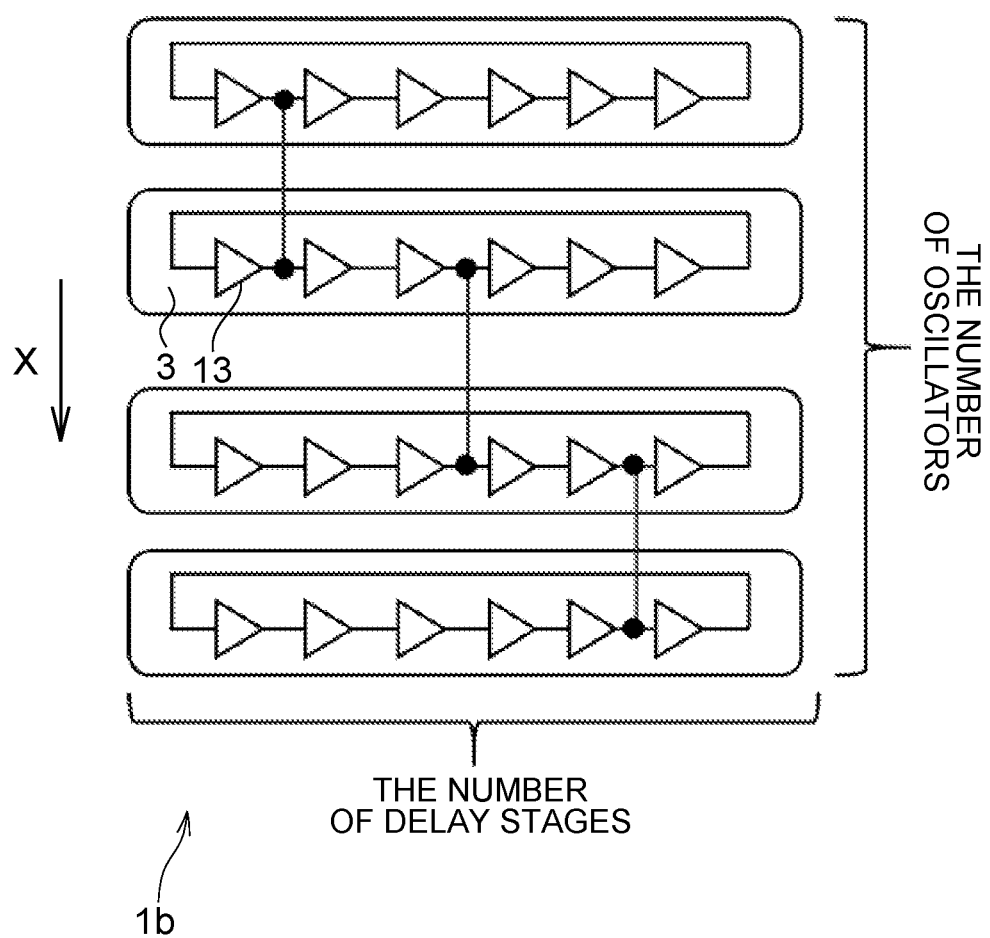
FIG. 5 is a circuit diagram of an oscillation circuit having a plurality of oscillators according to a third embodiment.

FIG. 5 is a circuit diagram of an oscillation circuit 1b having a plurality of oscillators 3 according to the third embodiment. The oscillation circuit 1b in FIG. 5 can be applied to the oscillation circuit 1b in the time-to-digital converter 2 in FIG. 1. The oscillation circuit 1b in FIG. 5 has a plurality of oscillators 3 aligned in a predetermined direction X. Although FIG. 5 illustrates an example in which the oscillation circuit 1b has four oscillators 3, the number of oscillators 3 in the oscillation circuit 1b is not particularly limited.

In each oscillator 3 in FIG. 5, delay elements 13 of the number of connection stages larger than the number of oscillators 3 in the oscillation circuit 1b are annularly connected. The output nodes of the delay elements 13 at any one stage are connected with each other for each combination of two oscillators 3 in the oscillation circuit 1b, while the delay elements 13 having connected output nodes are shifted by two stages in the alignment order of the plurality of oscillators 3. As a result, the parasitic capacitance at the place where the output nodes are connected with each other can be dispersed with high symmetry, and the linearity is also improved.

Note that the output nodes of the delay elements 13 may be connected with each other for each combination of two oscillators 3 to be shifted by a predetermined number of stages of three or more stages in the alignment order of the plurality of oscillators 3 in a case where the number of connection stages of the delay elements 13 in each oscillator 3 is larger than that in FIG. 5.

As described above, in the third embodiment, since the delay elements 13 having connected output nodes are shifted by a plurality of stages in the alignment order of the plurality of oscillators 3 in a case where the number of connection stages of the delay elements 13 in each oscillator 3 is larger than the number of the oscillators 3 in the oscillation circuit 1b, the places where the output nodes are connected with each other can be evenly dispersed in the oscillation circuit 1b, and the symmetry and the linearity can be improved.

Fourth Embodiment

Although the first to third embodiments described above have illustrated an example in which the oscillator 3 includes the plurality of delay elements 13 annularly connected, the number of connection stages of inverters needs to be an odd number in a case where inverters are used as the delay elements 13. On the other hand, in a case where differential amplifiers 15 of the differential input and the differential output are used as the delay elements 13, the number of connection stages of the differential amplifiers 15 may be an odd number or an even number. As a result, there is no restriction on the number of connection stages of the delay elements 13 in the oscillators 3.

Figure 6:
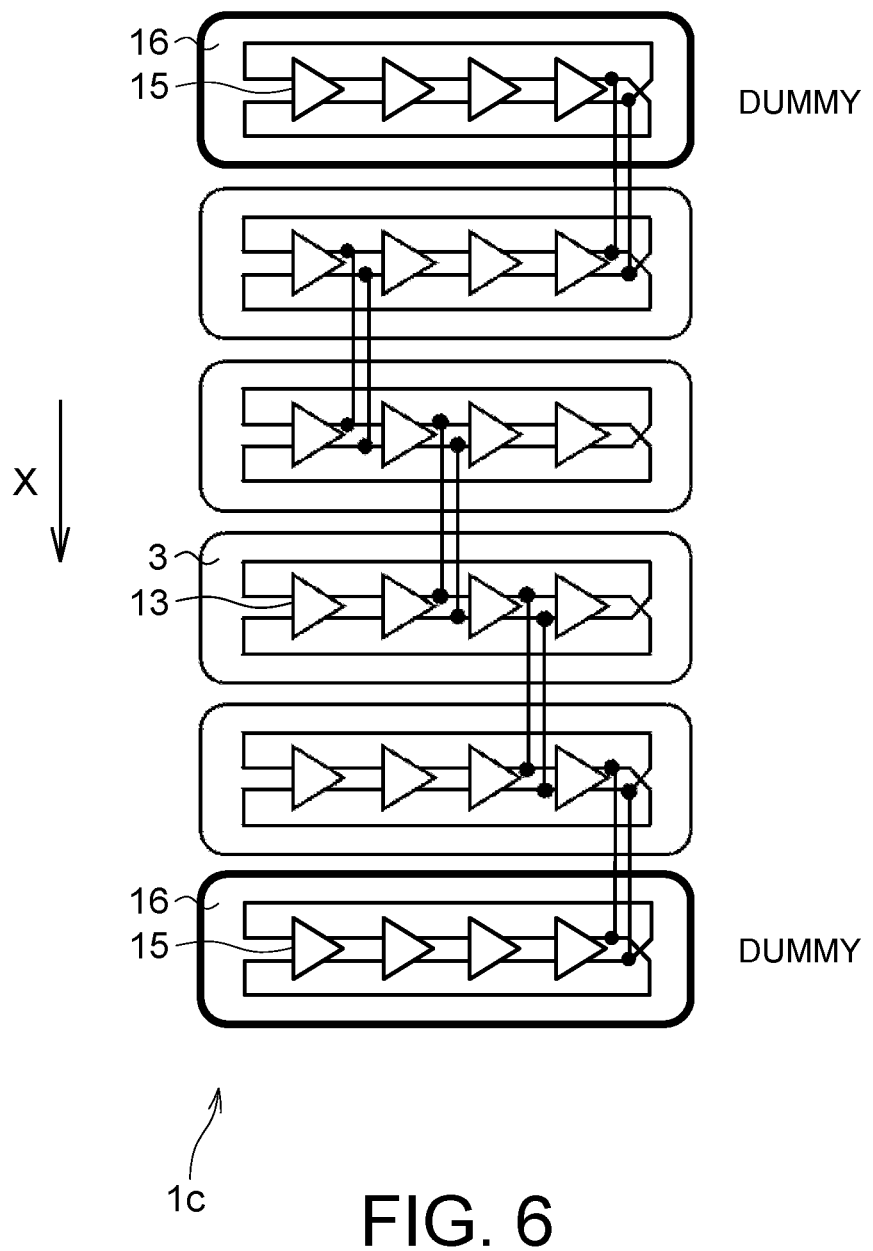
FIG. 6 is a circuit diagram of an oscillation circuit according to a fourth embodiment.

FIG. 6 is a circuit diagram of an oscillation circuit 1c according to the fourth embodiment. The oscillation circuit 1c in FIG. 6 can be applied to the oscillation circuit 1c in the time-to-digital converter 2 in FIG. 1. The oscillation circuit 1c in FIG. 6 has a plurality of oscillators 3 aligned in a predetermined direction X, and each oscillator 3 is configured by annularly connecting differential amplifiers 15 of an even number of stages (e.g., four stages). Two adjacent differential amplifiers 15 are connected with each other by a differential signal line.

Similarly to the first to third embodiments, in the oscillation circuit 1c according to the fourth embodiment, differential output nodes of differential amplifiers 15 at different stages are connected with each other for each combination of two oscillators 3 among the plurality of oscillators 3 aligned in the predetermined direction X.

Two dummy circuits 16 are provided on both sides in the predetermined direction X. Each dummy circuit 16 has, for example, the same circuit configuration as the internal configuration of each oscillator 3. That is, each dummy circuit 16 has a plurality of differential amplifiers 15 annularly connected. The differential output node of the differential amplifier 15 at the last stage of an oscillator 3 on one end side among the plurality of oscillators 3 arranged in the predetermined direction X is connected with the differential output node of the differential amplifier 15 at the last stage in an adjacent dummy circuit 16. Similarly, the differential output node of the differential amplifier 15 at the last stage of an oscillator 3 on the other end side is connected with the differential output node of the differential amplifier 15 at the last stage in an adjacent dummy circuit 16.

The dummy circuit 16 is used for the purpose of terminating the differential output node of the differential amplifier 15 at the last stage in the adjacent oscillator 3. Therefore, even if the dummy circuit 16 has the same internal configuration as the oscillator 3, the dummy circuit does not need to perform the oscillation operation. For example, the potential of the differential output node of each differential amplifier 15 in the dummy circuit 16 may be forcibly set to a fixed level. As a result, the oscillation operation of the dummy circuit 16 can be stopped to suppress the power consumption.

In the oscillation circuit 1c in FIG. 6, two differential amplifiers 15 having connected differential output nodes, or a differential amplifier 15 and a dummy circuit 16 are arranged adjacent to each other. As a result, the wiring length of the differential signal line having connected differential output nodes can be shortened, and the parasitic capacitance of the differential signal line can be reduced.

As described above, in the oscillation circuit 1c in FIG. 6, the plurality of oscillators 3 are not connected in a loop shape, but two dummy circuits 16 are arranged on both sides of the plurality of oscillators 3, the output node of the oscillator 3 on one end side is connected with the output node of one dummy circuit 16, and the output node of the oscillator 3 on the other end side is connected with the output node of the other dummy circuit 16. Moreover, output nodes are connected with each other for each combination of two oscillators 3 among the plurality of oscillators 3. As a result, output nodes of three or more oscillators 3 are prevented from being connected with each other at one place, so that the parasitic capacitance can be evenly dispersed.

Moreover, by providing the dummy circuits 16, it is not necessary to connect output nodes of two oscillators 3 that are not adjacent to each other, and the length of wiring for connecting the output nodes can be shortened, so that the parasitic capacitance can be reduced.

Moreover, in the oscillation circuit 1c in FIG. 6, differential amplifiers 15 in two oscillators 3 having connected differential output nodes are shifted by one stage along the predetermined direction. As a result, the symmetry and the linearity can be further improved.

By using the differential amplifiers 15 as the delay elements 13 in the oscillators 3 as illustrated in FIG. 6, the delay elements 13 in the oscillators 3 can be increased or decreased by one stage, and the oscillation frequency can be easily adjusted.

Figure 7:
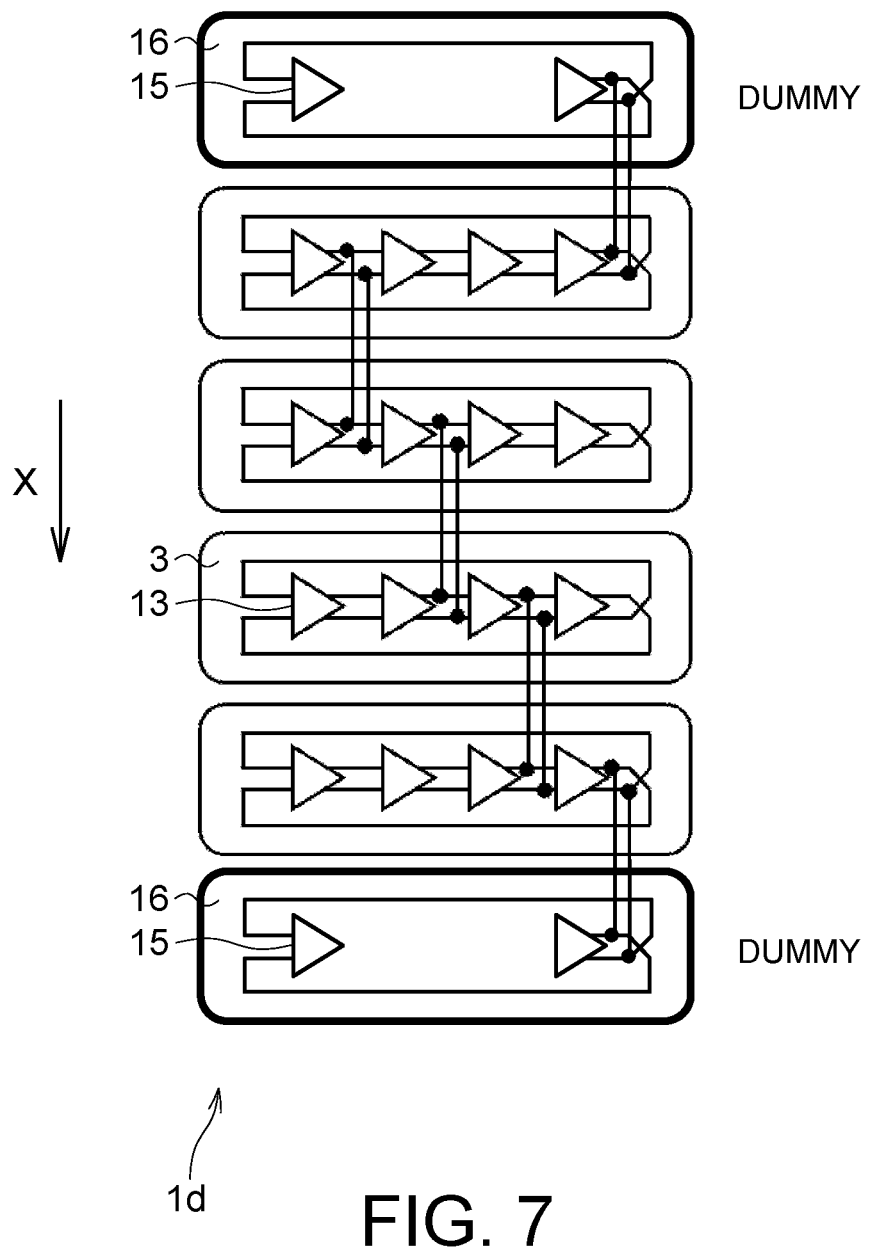
FIG. 7 is a block diagram of an oscillation circuit according to a variation.

Although the oscillation circuit 1c illustrated in FIG. 6 is an example in which the dummy circuits 16 having the same internal configuration as that of the oscillation circuit 1c are provided, the internal configuration of the dummy circuit 16 may be different from the internal configuration of the oscillation circuit 1c as in the oscillation circuit 1d according to a variation of FIG. 7. The example of FIG. 7 illustrates an example in which a dummy circuit 16 includes two differential amplifiers 15 annularly connected. A differential output node of a differential amplifier 15 on the subsequent stage side in the dummy circuit 16 is connected with a differential output node of a differential amplifier 15 at the last stage in the adjacent oscillator 3. Since the dummy circuit 16 in FIG. 7 also does not need to perform the oscillation operation, the potential of the differential output node of the differential amplifier 15 in the dummy circuit 16 may be set to a fixed level.

The dummy circuit 16 in FIGS. 6 and 7 may be provided in the oscillation circuit 1, 1a, or 1b in FIG. 1, 4, or 5. Although the plurality of oscillators 3 are connected in a loop shape by connecting output nodes of two oscillator groups 14 in the oscillation circuit 1a in FIG. 4, two dummy circuits 16 may be arranged on both end sides in the predetermined direction X instead of being connected in a loop shape, and each dummy circuit 16 may be connected with the delay element 13 at the last stage in the adjacent oscillator 3. As a result, similarly to the case of connection in a loop shape, the symmetry and the linearity can be improved.

Moreover, in the oscillation circuits 1c and 1d in FIGS. 6 and 7, the plurality of oscillators 3 may be classified into a plurality of oscillator groups 14 each having two or more oscillators 3 as in FIG. 4, and two differential output nodes may be connected with each other for each combination of two oscillators 3 for each oscillator group 14 in a case where the number of oscillators 3 is larger than the number of connection stages of the differential amplifiers 15 in each oscillator 3.

Furthermore, although the oscillation circuits 1c and 1d illustrated in FIGS. 6 and 7 are examples in which differential amplifiers 15 having connected differential output nodes are shifted by one stage, the differential output nodes of the differential amplifiers 15 may be connected with each other to be shifted by a plurality of stages as in FIG. 5 in a case where the number of connection stages of the differential amplifiers 15 in each oscillator 3 is large.

As described above, in the fourth embodiment, since each oscillator 3 is configured by annularly connecting the plurality of differential amplifiers 15, the oscillator 3 can be configured even if the number of connection stages of the differential amplifiers 15 in the oscillator 3 is an even number. Moreover, dummy circuits 16 are arranged on both end sides of the plurality of oscillators 3 aligned in the predetermined direction X, and the differential output nodes of the differential amplifiers 15 at the last stage in the oscillators 3 on both end sides are connected with the differential output nodes of the differential amplifiers 15 in the dummy circuits 16, so that the symmetry and the linearity can be further improved. Furthermore, by arranging dummy circuits 16 on both ends in the predetermined direction, it is not necessary to connect the output nodes of two oscillators 3 that are not adjacent to each other, the length of wiring for connecting the output nodes with each other can be shortened, and the parasitic capacitance can be reduced.

Fifth Embodiment

Figure 8:
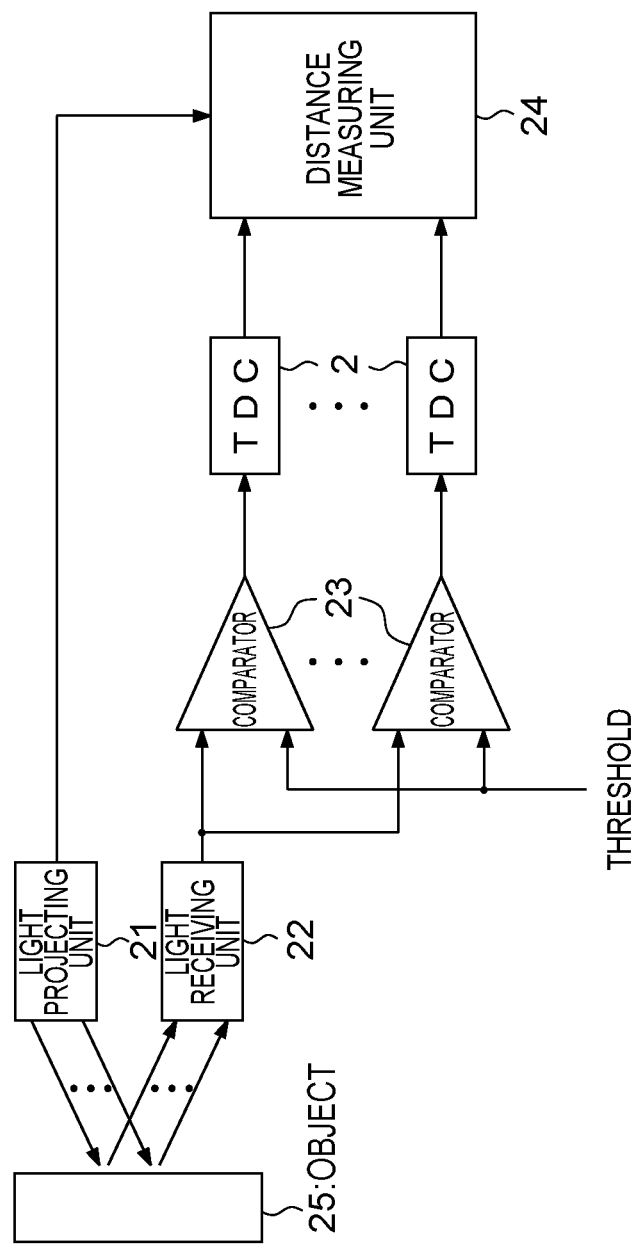
FIG. 8 is a block diagram illustrating a schematic configuration of an electronic device.

A time-to-digital converter 2 having an oscillation circuit 1, 1a, 1c, or 1d according to the first to fourth embodiments described above can be incorporated in, for example, an electronic device that performs distance measurement using the propagation time of an optical signal. FIG. 8 is a block diagram illustrating a schematic configuration of an electronic device 20. The electronic device 20 in FIG. 8 includes time-to-digital converters (TDC) 2 each having an oscillation circuit 1, 1a, 1c, or 1d according to the first to fourth embodiments.

The electronic device 20 in FIG. 8 has a light projecting unit 21, a light receiving unit 22, comparators 23, the TDCs 2, and a distance measuring unit 24.

The light projecting unit 21 projects multi-channel optical signals to an object 25. The optical signal is, for example, a pulse signal, and the light projecting unit 21 intermittently projects multi-channel optical signals at predetermined time intervals. The object 25 reflects the multi-channel optical signals from the light projecting unit 21. The light receiving unit 22 receives the multi-channel optical signals reflected by the object 25 and converts the optical signals into analog electric signals (which will be hereinafter referred to as reception signals).

The comparators 23 compare the signal levels of the multi-channel reception signals outputted from the light receiving unit 22 with a predetermined threshold and generates multi-channel time signals binarized depending on whether the signal levels are larger than the threshold or not. The multi-channel time signals are inputted to the TDCs 2 each having an internal configuration as illustrated in FIG. 1, for example, and are converted into digital signals. The distance measuring unit 24 measures the distance to the object 25 based on the digital signals outputted from the TDCs 2.

Since an oscillation circuit 1 according to the first to fourth embodiments can output highly accurate oscillation signals with the same frequency and phase, it is possible to accurately measure the distance to the object 25 by incorporating TDCs 2 each having such an oscillation circuit 1 in the electronic device 20.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. An oscillation circuit comprising:
a first oscillator having output nodes of n stages, where n is an integer of 3 or more;
a second oscillator having output nodes of n stages; and
a third oscillator having output nodes of n stages,
m oscillators including the first oscillator, the second oscillator, and the third oscillator, where m is an integer of 3 or more,
wherein an output node at an a-th stage of the first oscillator and an output node at an a-th stage of the second oscillator are connected with each other, where a is an integer of 1 or more and n or less,
an output node at a b-th stage of the second oscillator and an output node at a b-th stage of the third oscillator are connected with each other, where b is an integer of 1 or more and n or less different from a,
different output nodes are connected with each other for each combination of two oscillators among the m oscillators,
the oscillators have a plurality of delay elements connected in cascade,
an output signal of a delay element at a last stage is fed back to an input side of a delay element at a first stage, and
two oscillators adjacent in a predetermined direction connect output nodes of delay elements at a stage different from a stage of other two oscillators adjacent in the predetermined direction.

2. The oscillation circuit according to claim 1,
wherein the m oscillators are aligned in a predetermined direction, and
different output nodes are connected with one another for all combinations of two oscillators adjacent in the predetermined direction among the m oscillators.

3. The oscillation circuit according to claim 2, further comprising
a dummy circuit that has an output node connected with an output node of any one of the m oscillators and does not perform an oscillation operation.

4. The oscillation circuit according to claim 1,
wherein two dummy circuits are arranged on both end sides of the m oscillators arranged in the predetermined direction,
an output node of one of the dummy circuits is connected with any one of output nodes of an oscillator on one end side among the m oscillators aligned in the predetermined direction, and
an output node of the other of the dummy circuits is connected with any one of output nodes of an oscillator on one end side among the m oscillators aligned in the predetermined direction.

5. The oscillation circuit according to claim 1,
wherein delay elements that connect output nodes of two oscillators adjacent in an alignment order in the predetermined direction are arranged to be shifted by a predetermined number of stages according to an arrangement order in the predetermined direction.

6. The oscillation circuit according to claim 5,
wherein the predetermined number of stages is determined according to the number of the plurality of delay elements in an oscillator and the number of the m oscillators.

7. The oscillation circuit according to claim 1,
wherein the m oscillators are connected in a loop shape by connecting output nodes of delay elements at different stages in any two of the oscillators.

8. The oscillation circuit according to claim 1,
wherein the m oscillators are classified into a plurality of oscillator groups each having two or more oscillators, and
delay elements that connect output nodes in two oscillators adjacent in an alignment order in the predetermined direction are arranged to be shifted by a predetermined number of stages according to an arrangement order in the predetermined direction for each oscillator group.

9. The oscillation circuit according to claim 8,
wherein the plurality of oscillator groups connect output nodes of two oscillator groups for every two oscillator groups.

10. The oscillation circuit according to claim 8,
wherein all oscillators in the plurality of oscillator groups are connected in a loop shape.

11. The oscillation circuit according to claim 1,
wherein the delay element is a logic inversion element, and
the oscillator is configured by annularly connecting the logic inversion elements of an odd number of stages.

12. The oscillation circuit according to claim 1, wherein the delay element is a differential amplifier of a differential input and a differential output, and
the oscillators are configured by connecting the differential amplifiers of an even number of stages or an odd number of stages in cascade.

13. A time-to-digital converter comprising:
a plurality of oscillators that output oscillation signals having the same phase and the same frequency;
a counter that measures periodicity of an oscillation signal outputted from any one of the plurality of oscillators;
a plurality of phase detectors that each detect a phase of an oscillation signal outputted from a corresponding oscillator when logic of a plurality of time signals transitions;
a plurality of count holders that hold count values of the counter when logic of the plurality of time signals transitions; and
a digital signal generator that generates a plurality of digital signals corresponding to the plurality of time signals based on the count values held in the plurality of count holder and the phases detected by the plurality of phase detectors,
wherein the plurality of oscillators comprise:
a first oscillator having output nodes of n (n is an integer of 3 or more) stages;

a second oscillator having output nodes of n stages; and
a third oscillator having output nodes of n stages,
an output node at an a-th stage of the first oscillator and an output node at an a-th stage of the second oscillator are connected with each other, where a is an integer of 1 or more and n or less, and
an output node at a b-th stage of the second oscillator and an output node at a b-th stage of the third oscillator are connected with each other, where b is an integer of 1 or more and n or less different from a.

14. The time-to-digital converter according to claim 13, comprising:
m oscillators including the first oscillator, the second oscillator, and the third oscillator, where m is an integer of 3 or more,
wherein different output nodes are connected with each other for each combination of two oscillators among the m oscillators.

15. The time-to-digital converter according to claim 14, wherein the m oscillators are aligned in a predetermined direction, and
different output nodes are connected with each other for all combinations of two oscillators adjacent in the predetermined direction among the m oscillators.

16. The time-to-digital converter according to claim 14, wherein the oscillators have a plurality of delay elements connected in cascade,
an output signal of a delay element at a last stage is fed back to an input side of a delay element at a first stage, and
two oscillators adjacent in the predetermined direction have connected output nodes of delay elements at a stage different from a stage of other two oscillators adjacent in the predetermined direction.

17. The time-to-digital converter according to claim 16, wherein delay elements having connected output nodes of two oscillators adjacent in an alignment order in the predetermined direction are arranged to be shifted by a predetermined number of stages according to an arrangement order in the predetermined direction.

18. An electronic device comprising:
a light receiver that receives a plurality of optical signals reflected at a plurality of places of an object and generates a plurality of time signals;
a time-to-digital converter that generates a plurality of digital signals based on the plurality of time signals; and
a distance measurer that measures a distance to the object based on the plurality of digital signals,
wherein the time-to-digital converter includes:
a plurality of oscillators that output oscillation signals having the same phase and the same frequency;
a counter that measures periodicity of an oscillation signal outputted from any one of the plurality of oscillators;
a phase detector that detects phases of a plurality of oscillation signals outputted from the plurality of oscillators when logic of the plurality of time signals transitions; and
a digital signal generator that outputs a digital signal corresponding to the plurality of time signals based on the periodicity measured by the counter when logic of the plurality of time signals transitions and the phase detected by the phase detector,
the plurality of oscillators comprise:
a first oscillator having output nodes of n stages, where n is an integer of 3 or more;
a second oscillator having output nodes of n stages; and
a third oscillator having output nodes of n stages,
an output node at an a-th stage of the first oscillator and an output node at an a-th stage of the second oscillator are connected with each other, where a is an integer of 1 or more and n or less, and
an output node at a b-th stage of the second oscillator and an output node at a b-th stage of the third oscillator are connected with each other, where b is an integer of 1 or more and n or less different from a.

* * * * *